(12) United States Patent
Hsu

(10) Patent No.: US 6,897,668 B1
(45) Date of Patent: May 24, 2005

(54) DOUBLE-FACED DETECTING DEVICES FOR AN ELECTRONIC SUBSTRATE

(75) Inventor: Ming-Huey Hsu, Hsinchu (TW)

(73) Assignee: Premtek International Inc., Hsinchu (TW)

(*) Notice: Subject to any disclaimer, the term of this patent is extended or adjusted under 35 U.S.C. 154(b) by 0 days.

(21) Appl. No.: 10/724,512

(22) Filed: Nov. 28, 2003

(51) Int. Cl.$^7$ ............................................. G01R 31/02
(52) U.S. Cl. ..................................... 324/754; 324/758
(58) Field of Search ................................ 324/754, 755, 324/757, 758, 761, 762, 765

(56) References Cited

U.S. PATENT DOCUMENTS

| | | | | |
|---|---|---|---|---|
| 3,453,545 A | * | 7/1969 | Oates | ........................... 324/757 |
| 3,551,807 A | * | 12/1970 | Burke et al. | ................ 324/72.5 |
| 3,701,021 A | * | 10/1972 | Issac et al. | .................. 324/754 |

* cited by examiner

Primary Examiner—David Zarneke
Assistant Examiner—Russell M. Kobert
(74) Attorney, Agent, or Firm—Alan D. Kamrath; Nikolai & Mersereau, P.A.

(57) ABSTRACT

Double-faced detecting devices for an electronic substrate, the detecting device have a base and two probe-detecting machines oppositely located beside the base. The base has a guiding groove and a substrate platform with a through hole rotatably and movably mounted on the base via the guiding groove. Therefore, when the electronic substrate mounts on the substrate platform, the substrate platform enables to rotate from a horizontal position to a vertical position to expose two faces of the electronic substrate to face the two probe-detecting machines for a double-faced detection of the electronic substrate in high-frequency properties. Additionally, each probe-detecting machine is mounted on a pivot base and pivoted by the pivot base to adjust the height of probe to touch the electronic substrate at the vertical position.

4 Claims, 5 Drawing Sheets

DOUBLE-FACED DETECTING DEVICES FOR AN ELECTRONIC SUBSTRATE

FIELD OF THE INVENTION

In general, the present invention relates to double-faced detecting devices for an electronic substrate, and more particularly to detecting devices that enables to alternatively place the electronic substrate in a horizontal position or a vertical position to detect high-frequency properties of the electronic substrate.

BACKGROUND OF THE INVENTION

With reference to FIG. 5, conventional detecting devices for an electronic substrate, such as a flip chip, a wafer or a printed circuit board (PCB), in high-frequency properties comprises two opposite probe-detecting machines 50 and a substrate platform 70. Each probe-detecting machine 50 has a probe 51 secured on an inward face of the probe-detecting machine 50 and connects to a detecting system (example: networking analysis instrument) via a high-frequency isolation wire (not shown). The two probe-detecting machines 50 are respectively mounted on two bases 60. The substrate platform 70 is located between the two probe-detecting machines 50. The substrate platform 70 has a top face for securing the flip chip, the wafer or the printed circuit board (not shown).

When the detecting devices operate, a calibration substrate 90 with multiple detecting points 91 (or so-called "pads") is placed on the top face of the substrate platform 70 for adjustment by the two probes 51 on the two probe-detecting devices 50. After adjustment, the calibration substrate 90 is removed from the substrate platform 70. Then, the flip chip, the wafer or the printed circuit board (not shown) with multiple detecting points is settled on the top face of the substrate platform 70. The probes 51 on the probe-detecting machines 50 extend to touch multiple detecting points 91 to detect high-frequency properties of the electronic substrate.

However, the flip chip, the wafer or the printed circuit board usually has the multiple detecting points formed on a top face and a bottom face in an ideal configuration. For convenience in detection, most of the flip chips, the wafers or the printed circuit boards are designed to arrange the multiple detecting points of circuit on the same face. Unfortunately, data of high-frequency properties obtained from the designed wafers or the printed circuit boards are only simulating data that is not precise. Additionally, only 80% of the electronic substrates can be modified and be detected by the conventional detecting devices. Rest of the electronic substrate still can not be modified in circuit to arrange the multiple detecting points on the same face and thus can not be detected.

SUMMARY OF THE INVENTION

The present invention provides double-faced detecting devices for an electronic substrate in high-frequency properties, which conveniently contact multiple detecting points on two faces of the electronic substrate to detect the high-frequency properties.

To achieve the foregoing purpose, the double-faced detecting devices for an electronic substrate comprise:

a base with a substrate platform movably and rotatably attached to the base, and through hole defined in the substrate platform, wherein the substrate platform is adapted to settle the electronic substrate on the substrate platform and is controlled by a controlling device to locate at a horizontal position or a vertical position;

two pivot bases oppositely placed beside the substrate platform and each pivot base has a levering plate; and two probe-detecting machines respectively and pivotally mounted on the levering plates of the two pivot bases, wherein each probe-detecting machine has a probe extending toward to the substrate platform to touch the electronic substrate.

Whereby, the electronic substrate is rotated and erected to the vertical position to expose two faces to respectively face the two probe-detecting machines to allow multiple detecting points on the two faces to be touched in a convenient way.

DETAILED DESCRIPTION OF THE PREFERRED EMBODIMENT

Figure 1:
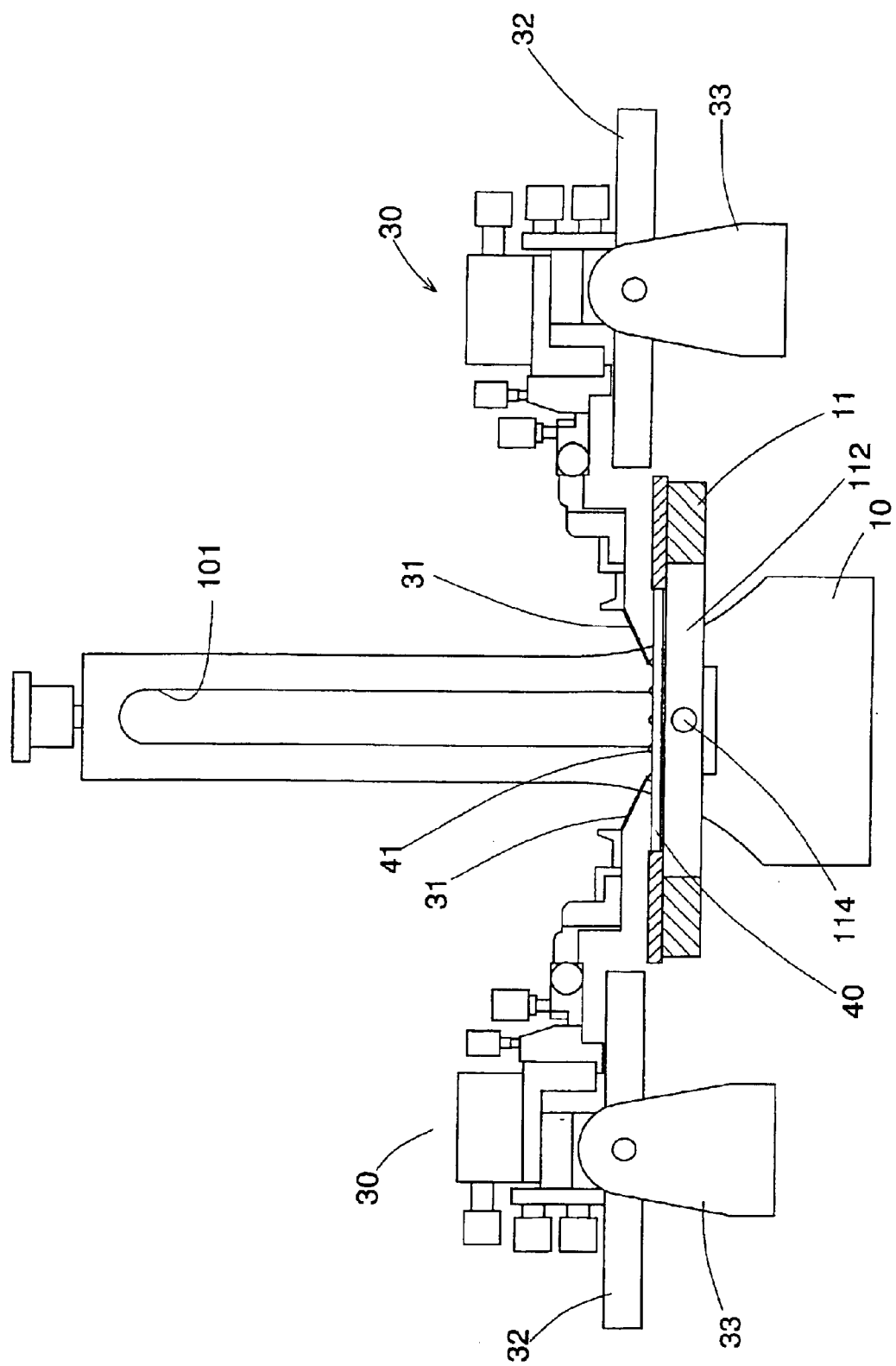
FIG. 1 is a schematically side plane view of double-faced detecting devices for an electronic substrate in accordance with the present invention.
Figure 2:
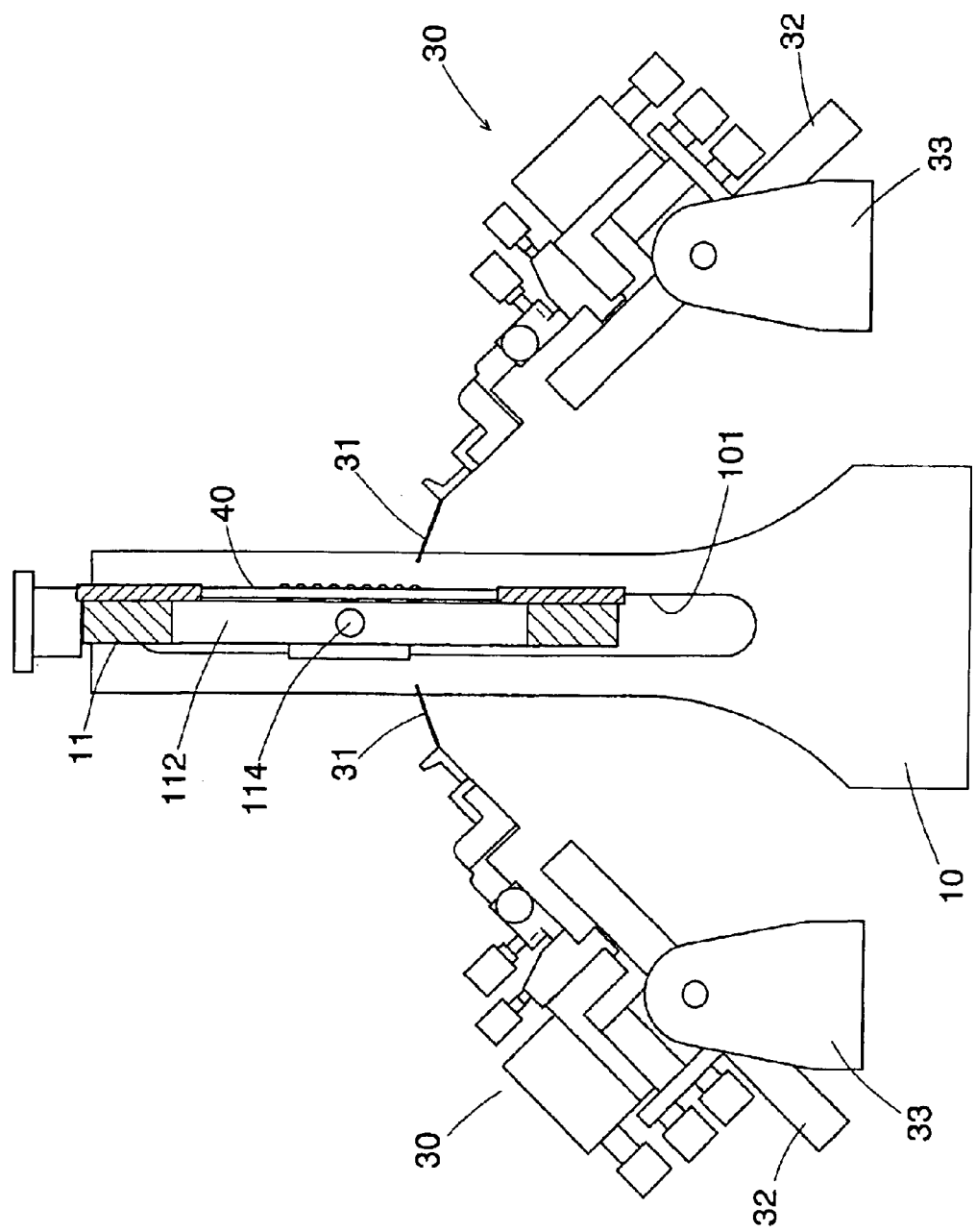
FIG. 2 is a schematically operational side plane view of the detecting devices for an electronic substrate in FIG. 1, wherein a substrate platform is located at a vertical position.

With reference to FIGS. 1 and 2, double-faced detecting devices for an electronic substrate 40 in accordance with the present invention comprises a base 10 with a substrate platform 11, two pivot bases 33, two probe-detecting machines 30 respectively mounted on the two pivot bases 33. Particularly, the electronic substrate 40 has a top face and a bottom face and multiple contacts 41 respectively arranged on the top and bottom faces.

The base 10 has an erecting post (not numbered) with a front face, an guiding groove 101 longitudinally defined in the front face of the erecting post, and the substrate platform 11 with a connecting rod 112 movably and rotatably attached to the erecting post via the guiding groove 101. The substrate platform 11 has a top face. A through hole 114 is defined in the substrate platform 11 and has a diameter smaller than that of the electronic substrate 40. Therefore, the electronic substrate 40 enables to be mounted on the top face of the substrate platform 11 and exposes the bottom face of the electronic substrate 40 via the through hole 114. The substrate platform 11 is controlled by a controlling device (not shown) to move vertically to change the height of electronic substrate 40. Additionally, the substrate platform 11 also enables to be rotated to hold the electronic substrate 40 at a horizontal position or a vertical position. Preferably, the substrate platform 11 rotates from 0 to 90 degrees.

The two pivot bases 33 are oppositely located beside the substrate platform 11. Each pivot base 33 has a levering plate 32. Each probe-detecting machine 30 is mounted on the levering plate 32 and has a probe 31 retractably extending toward to the electronic substrate 40. Whereby, the probe-detecting machine 30 can be pivoted to allow the probe 31 being inclined to extend upward to reach the contacts 41 at high locations when the electronic substrate 40 is in the vertical position.

Figure 3:
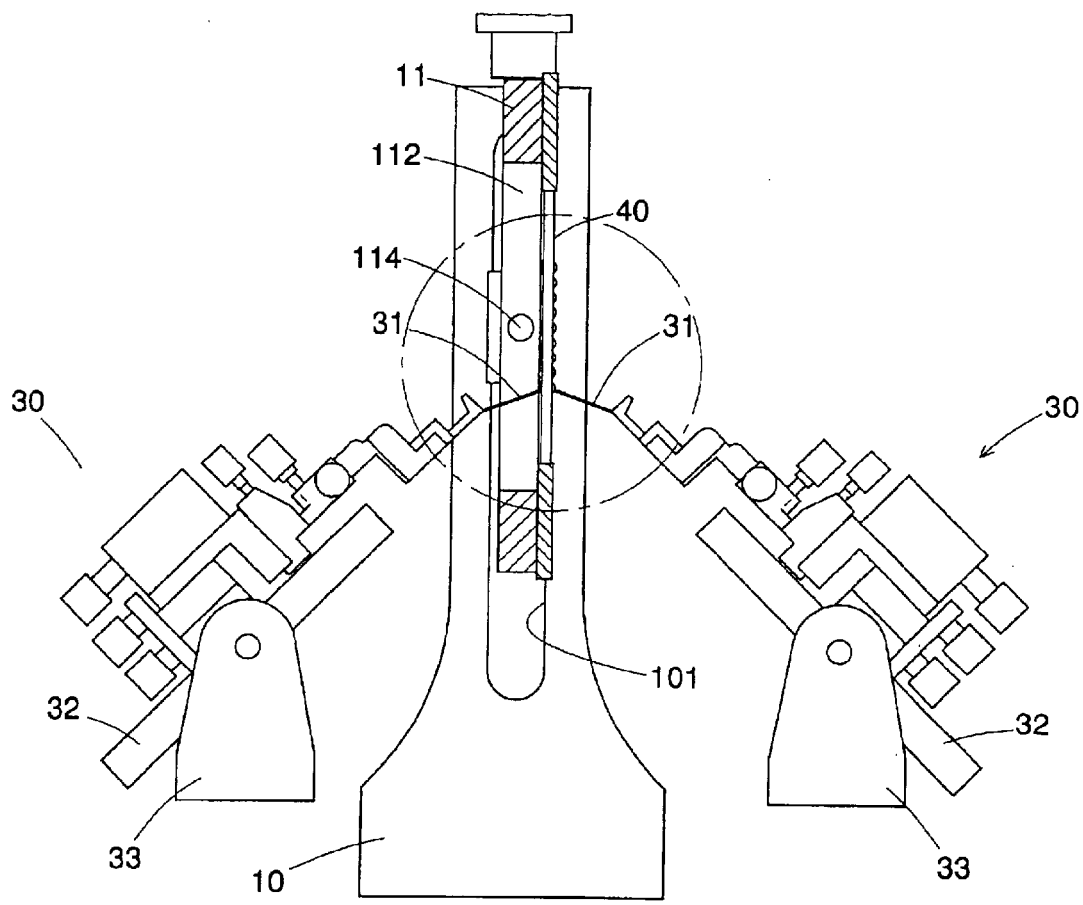
FIG. 3 is a schematically operational side plane view of the detecting devices in FIG. 2, wherein two probes of two opposite probe-detecting machines extend to touch multiple detecting points on two sides of the electronic substrate.
Figure 4:
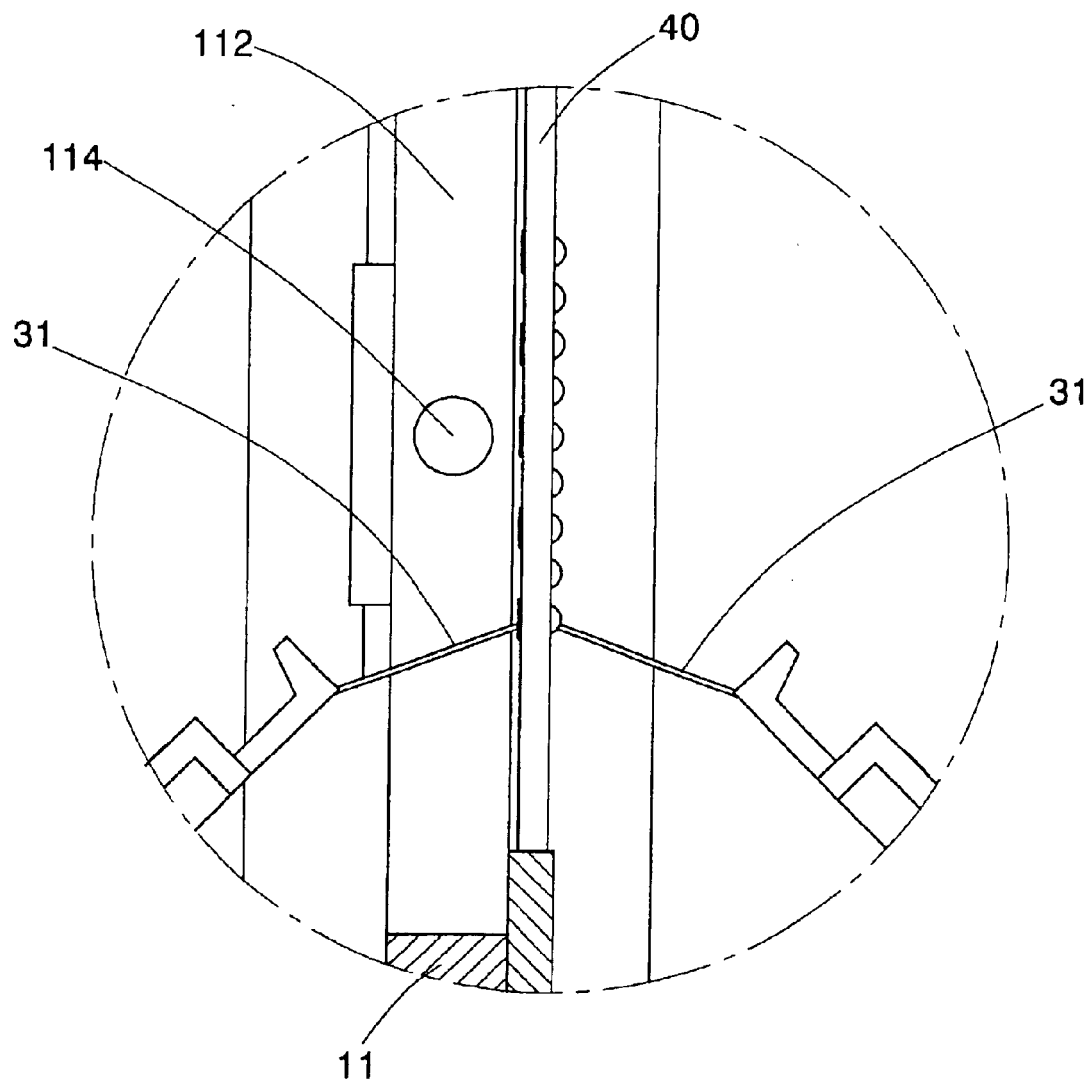
FIG. 4 is a partially enlarged side plane view of the detecting devices in FIG. 3 to clearly show conjunctions of the probes and the detecting points of the electronic substrate.
Figure 5:
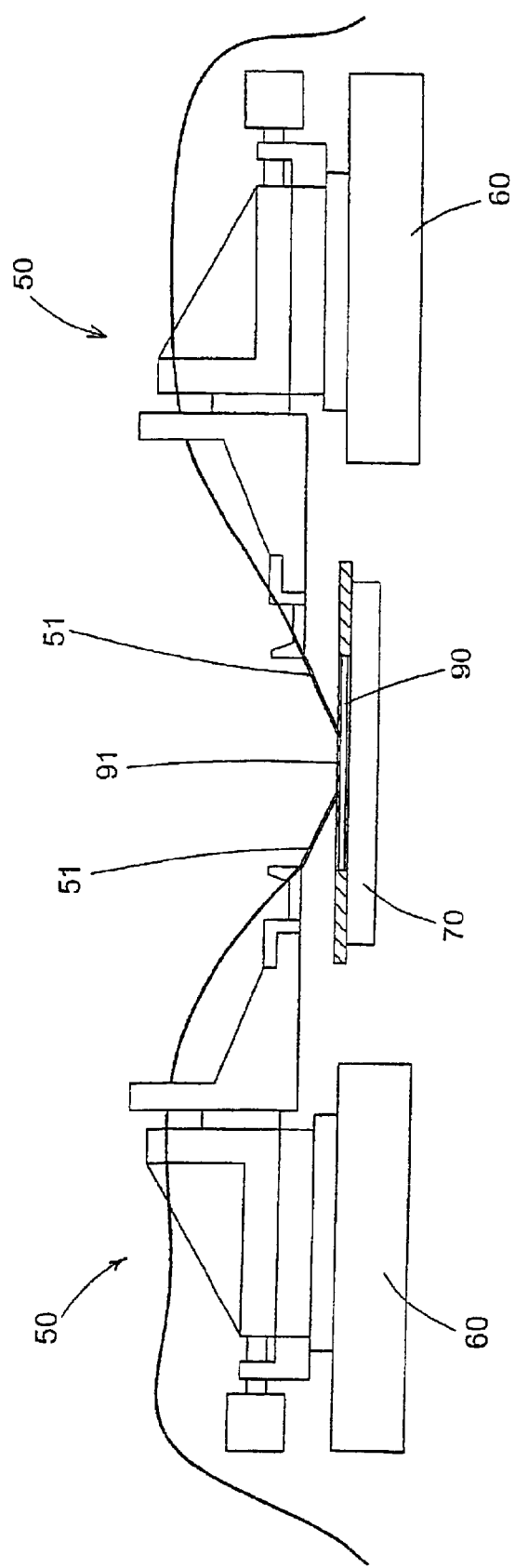
FIG. 5 is a schematically operational side plane view of conventional detecting devices for an electronic substrate in accordance with prior art.

With further reference to FIGS. 3 and 4, when the detecting devices operate to probe the electronic substrate 40, the substrate platform 11 horizontally arises and then rotates to the vertical position to expose the two faces of the electronic substrate 40 to respectively face the two probe-detecting machines 30. Because the contacts 41 on the electronic substrate 40 are at high positions when the substrate platform 11 is arisen to the vertical position, the pivot bases 33 rotate the levering plates 32 to adjust inclinations of the two probes 31 on the two probe-detecting machines 30. Thereby, the probes 31 enable to probe the contacts 41 to detect the high-frequency properties of the electronic substrate 40.

For an actually complete operation, a calibration substrate is applied on the detecting devices initially for adjustment as described in the conventional ones. Then, a flip chip, a wafer or a printed circuit board is mounted on the top face of the substrate platform 11 to detect high-frequency properties. Operational procedures of the detecting devices for each detection of any electronic substrate, whether the calibration substrate or the flip chip, the wafer or the printed circuit board, are the same as described as in the conventional detecting devices.

Although particular and specific embodiments of the invention have been disclosed in some detail, numerous modifications will occur to those having skill in the art, which modifications hold true to the spirit of this invention. Such modifications are deemed to be within the scope of the following claims.

What is claimed is:

1. Double-faced detecting devices for an electronic substrate with two faces, the detecting devices comprising:
   a base having an erecting post with a front face, an guiding groove longitudinally defined in the front face of the erecting post, a substrate platform movably and rotatably attached to the erecting post via the guiding groove, and a through hole defined in the substrate platform, wherein the substrate platform is adapted to settle the electronic substrate on the substrate platform and is controlled by a controlling device to locate at a horizontal position or a vertical position;
   two pivot bases oppositely placed beside the substrate platform, wherein each pivot base has a levering plate; and
   two probe-detecting machines respectively and pivotally mounted on the levering plates of the two pivot bases, wherein each probe-detecting machine has a probe extending toward to the substrate platform and adapted to touch the electronic substrate.

2. The double-faced detecting devices as claimed in claim 1, wherein the substrate platform rotates within 0 to 90 degrees.

3. The double-faced detecting devices as claimed in claim 1, wherein the electronic substrate is a flip chip.

4. The double-faced detecting devices as claimed in claim 1, wherein the electronic substrate is a printed circuit board.

* * * * *